United States Patent [19]

Runas

[11] Patent Number: 5,612,644
[45] Date of Patent: Mar. 18, 1997

[54] CIRCUITS, SYSTEMS AND METHODS FOR CONTROLLING SUBSTRATE BIAS IN INTEGRATED CIRCUITS

[75] Inventor: Michael E. Runas, McKinney, Tex.

[73] Assignee: Cirrus Logic Inc., Fremont, Calif.

[21] Appl. No.: 521,891

[22] Filed: Aug. 31, 1995

[51] Int. Cl.⁶ .................................................. G05F 1/10
[52] U.S. Cl. ........................ 327/535; 327/534; 327/540
[58] Field of Search ................................. 327/534, 535, 327/536, 537, 540, 541

[56] References Cited

U.S. PATENT DOCUMENTS

| Re. 34,797 | 11/1994 | Sato et al. | 327/534 |
|---|---|---|---|
| 4,961,007 | 10/1990 | Kumanoya et al. | 327/537 |
| 5,034,625 | 7/1991 | Min et al. | 327/537 |
| 5,041,739 | 8/1991 | Goto | 327/536 |
| 5,072,134 | 12/1991 | Min | 327/537 |
| 5,227,627 | 7/1993 | Taguchi | 327/535 |
| 5,329,168 | 7/1994 | Sugibayashi et al. | 327/535 |
| 5,408,140 | 4/1995 | Kawai | 327/537 |
| 5,561,385 | 10/1996 | Choi | 327/536 |

FOREIGN PATENT DOCUMENTS 2-302076  12/1990  Japan ..................... 327/536

*Primary Examiner*—Terry Cunningham
*Attorney, Agent, or Firm*—Winstead Sechrest & Minick

[57] ABSTRACT

Substrate bias control circuitry 100 is provided which includes a bias sensor 101 for measuring a bias voltage of a substrate and generating a control signal and response. A master oscillator 102 is provided for generating a first driving signal, a frequency of the first driving signal adjusted by the control signal generated by the bias sensor 101. A first charge pump 103 is provided for pumping electrons into a substrate in response to the first driving signal. A slave oscillator generates a second driving signal, a frequency of the second driving signal is determined from the frequency of the first driving signal using a phase-locked loop. A second charge pump 105 is provided for pumping electrons into the substrate in response to the second driving signal.

23 Claims, 1 Drawing Sheet

CIRCUITS, SYSTEMS AND METHODS FOR CONTROLLING SUBSTRATE BIAS IN INTEGRATED CIRCUITS

TECHNICAL FIELD OF THE INVENTION

The present invention relates in general to electronic circuits and devices and in particular to circuits, systems and methods for controlling substrate bias in integrated circuits.

BACKGROUND OF THE INVENTION

One recurring problem which can arise during the operation of dynamic random access memories (DRAMs) is the degradation of data stored on the DRAM cell capacitors due to minority carrier injection into the substrate. This typically occurs when the address and data lines to the memory device switch low and the corresponding bond pads, which reside on the surface of the substrate, spike below zero volts. This spiking can become particularly pronounced if the inductance of the address and data lines is not well controlled.

In an n-channel memory cell storing a logic 1, a depletion area is created around the n+ doped region common to the access transistor and the storage capacitor. Minority carriers, in this case electrons, injected into the substrate from the spiking can recombine with the holes in the depletion area and cause charge to leak-off the storage capacitor. By biasing the substrate at a negative voltage, diodes formed at the bond pad structures cannot be biased by an undershoot and thus, electron injection into the substrate is prevented.

A negative substrate bias is achieved typically by pumping electrons into the substrate with a substrate pump. Generally, pumping is performed until the substrate reaches equilibrium and before any writes are made to the cells of the array (electrons from pad undershoot in contrast are appear quickly and if allowed to reach the array, cause leakage).

This technique has serious drawbacks when a large array of DRAM cells has been fabricated on a large substrate. Among other things, the substrate voltage at different locations around the substrate may differ substantially, depending on the distance from the charge pump, the distance from the bond pads, and the substrate resistance. For example, the substrate voltage in regions significantly separated from the charge pump may not be sufficiently reduced to effectively control data degradation in the cells fabricated those regions. This problem may be solved by using a charge pump with larger capacitors; however, even with larger capacitors some voltage drop off will still occur as the distance from the charge pump increases.

Thus, the need has arisen for circuits, systems and methods for controlling the voltage bias of a substrate. In particular, such circuits, systems and methods should be applicable to control the DRAM cell leakage from charge injection into large substrates and/or substrates supporting large cell arrays.

SUMMARY OF THE INVENTION

In general, the principles of the present invention advantageously allow for multiple charge pumps to be employed in the control of substrate bias. Among other things, multiple charge pumps allow for a more consistent (equipotential) bias to be achieved throughout the entire substrate. Circuits, systems and methods embodying the principles of the present invention are particularly useful in such circuits such as DRAMs where control of the substrate bias can be critical for maintaining good device performance.

According to a first embodiment of the present invention, bias control circuitry is provided which includes a bias sensor for measuring the bias voltage of a substrate and generating a control signal in response. A master oscillator is included for generating a first driving signal, a frequency of the first driving signal adjusted by the control signal generated by the bias sensor. A first charge pump is included for pumping electrons into the substrate in response to the first driving signal. A slave oscillator is provided for generating a second driving signal, the frequency of the second driving signal determined from the frequency of the first driving signal using a phase-locked loop. Finally, a second charge pump is provided for pumping electrons into the substrate in response to the second driving signal.

According to another embodiment of the present invention, an electronic circuit is provided which includes a substrate. A bias sensor is coupled to the substrate for measuring the substrate bias voltage. A first oscillator is included for generating a first charge pump driving signal, the frequency of which is controlled by a control signal output from the bias sensor. A first charge pump, which is driven by the first driving signal, is provided for pumping electrons into the substrate. A second oscillator is provided for generating a second charge pump driving signal, the second charge pump driving signal phase-locked with the first charge pump driving signal. The second charge pump driving signal drives a second charge pump for pumping electrons into the substrate.

According to a further embodiment of the present invention, substrate bias voltage control circuitry is provided which includes first and second bias sensors for sensing the bias voltage of respective first and second selected regions of a substrate. Comparator circuitry is provided for comparing the output of the first and second sensors and generating in response a control signal representing the difference therebetween. First charge pumping circuitry is provided which includes a first oscillator and a first charge pump. Second charge pumping circuitry is provided including a second oscillator and a second charge pump. Control logic is included for adjusting the output frequencies of the first and second oscillators in response to the control signal generated by the comparator circuitry to achieve an equipotential bias across the substrate.

According to an additional embodiment of the present invention, an electronic circuit is provided which includes a substrate. A plurality of sensors, each for sensing the bias voltage of a corresponding region of the substrate and outputting a proportionate sense signal, are coupled to the substrate. A plurality of charge pumping circuits are coupled to the substrate for lowering the bias voltage of corresponding regions of the substrate, each charge pumping circuit including an oscillator and a charge pump. Comparator circuitry is included for comparing the sense signals output from the bias sensors and generating control signals representing a profile of the bias voltage across the substrate. Finally, control logic is provided for adjusting the output frequencies of the oscillators in response to the control signals.

The principles of the present invention are also embodied in methods for controlling the bias voltage of a substrate. According to a first method, a bias voltage is measured at a selected point on the substrate. A first driving signal is generated, the frequency of which is adjusted in response to the bias voltage measured at the selected point. Electrons are pumped into the substrate in response to the first driving signal using a first charge pump. A second driving signal is generated, the frequency of which is determined from the frequency of the first driving signal by a phase-locked loop. Finally, electrons are pumped into the substrate in response to the second driving signal with a second charge pump.

In a second method according to the principles of the present invention, the bias voltage of a plurality of regions of a substrate are sensed. The bias voltage sensed at each of the regions are compared to establish a profile of the bias voltage across the substrate. Electrons are pumped into the regions of the substrate to lower the bias voltages thereof with a corresponding plurality of charge pumping circuits. Finally, the frequencies of the charge pumping circuits are adjusted in response to the sensed profile of the bias voltage across the substrate.

Circuits, systems and methods embodying the principles of the present invention have provided substantial advantages over the prior art. In particular, such circuits, systems and methods allow for the use of multiple charge pumps to lower the bias voltage of a given substrate. Among other things, the principles of the present invention can be advantageously applied to the control of DRAM cell data degradation which often occurs from electron injection into the substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiments depicted in FIGS. 1–4 of the drawings, in which like numbers designate like parts.

Figure 1:
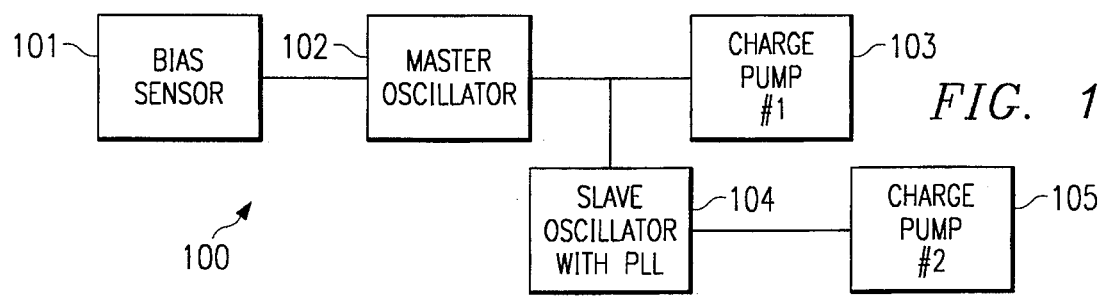
FIG. 1 is a functional block diagram of a charge pumping system according to the principles of the present invention.

FIG. 1 is a functional block diagram of a charge pump control system 100 embodying the principles of the present invention. System 100 includes a bias sensor 101, master oscillator 102, a first charge pump 103 driven by master oscillator 102, slave oscillator and phase-locked loop 104, and a second (slave) charge pump 104 driven by slave oscillator 104. It should be recognized at this point that the principles of the present invention are not limited to systems in which only two charge pumps are employed; in alternate embodiments of system 100, additional slave charge pumps and associated slave oscillators/phase locked loops may be provided. Multiple charge pumps advantageously allow for more consistent biasing across a given substrate and/or the biasing of larger substrates.

In the preferred embodiment, oscillators 102 and 104 are voltage controlled oscillators whose output frequency can be adjusted through the application of an appropriate control voltage as is known in the art. Alternatively, oscillators 102 and 104 may be controllable in response to digital signals. Correspondingly, bias sensor 101 is a conventional sensor which senses the substrate bias voltage with respect to ground and outputs either a proportionate voltage or a digital word in response. In the preferred embodiment, charge pumps 103 and 105 are conventional charge pumps which lowers the substrate bias voltage $V_{BB}$ by pumping electrons into the substrate. As is known in the art, the typical charge pump includes a first diode having its anode coupled to the substrate and a cathode coupled to the anode of a second diode (the diode common node). The cathode of the second diode is coupled to ground. The common node of the two diodes is driven by the corresponding oscillator through driving circuitry which typically includes a series capacitor. When the alternating signal out of the driving oscillator is near its peak positive value the second diode turns on and electrons are pulled from the ground node. When the output of the driving oscillator reaches its peak negative value, the first diode is turned on and the second diode is turned off and the electrons are transported into the substrate.

During operation of system 100, the frequency of master oscillator 102 is adjusted by bias sensor 101 as bias sensor 102 monitors (senses) the voltage of substrate 200. If the substrate voltage increases, assuming a substrate including n-channel devices, the frequency is increased to increase electron pumping and if the substrate voltage becomes too low, the frequency is similarly decreased. The frequency of slave oscillator 104, which drives second charge pump 105, is controlled with a phase-locked loop operating off of the master oscillator 102. This allows the charge pumps 103 and 105 to operate in tandem. By adjusting the phase difference between the master oscillator 102 output and the slave oscillator 104 output, and hence the output frequency of slave oscillator 104, substantial localized control over the substrate voltage can be achieved. By increasing the frequency of master oscillator 102 and/or slave oscillator 104 the electron pumping is correspondingly increased as required to lower the substrate voltage in the associated areas of the substrate.

Figure 2:
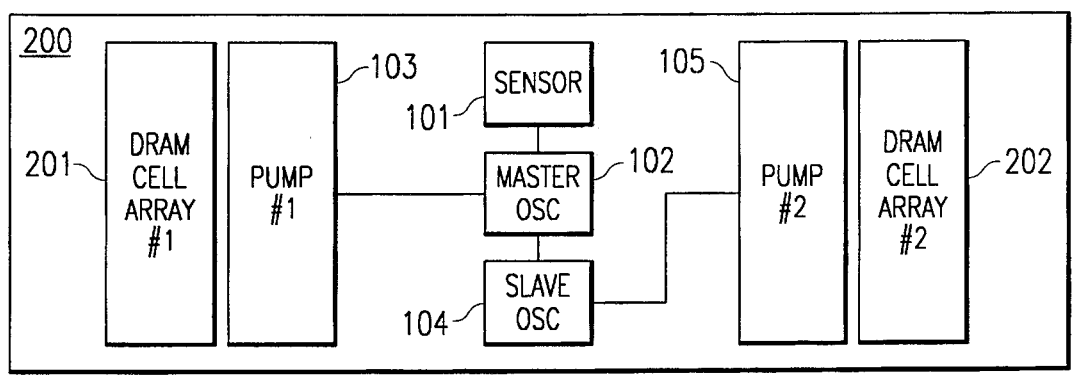
FIG. 2 is a plan view of an electronic circuit illustrating one application of the system of FIG. 1.

Control system 100 is particularly useful for controlling charge injection in integrated circuits applications where a single charge pump is incapable of sufficiently controlling the bias voltage across the entire substrate. One such instance is illustrated in FIG. 2, where two DRAM cell arrays 201 and 202 are fabricated on a single substrate 200. First charge pump 103 is disposed to bias substrate 200 in the region of cell array 201 and second charge pump 105 is disposed to bias substrate 200 in the region of cell array 202. In this example the bias sensor is disposed between the cell arrays. It should be noted that in alternate embodiments, charge pumps 103 and 105 and sensor 101 may be disposed in varying locations around substrate 200. For example, charge pumps 103 and 105 may be disposed on the opposite sides of arrays 201 and 202 respectively which would both place the charge pumps at the extremities of substrate and increase their spacing from sensor 101. The location of the charge pumps 103 and 105, and their spacing from sensor 101 will depend on such factors as the location of the bond pads (interconnecting to the circuitry on substrate 200 external devices not shown) and the resistance of substrate 200.

It should be noted that the two memory array application of system 100 shown in FIG. 2 is an exemplary application and that systems embodying the principles illustrated by system 100 may be applied to a number of instances in which substrate biasing is required.

Figure 3:
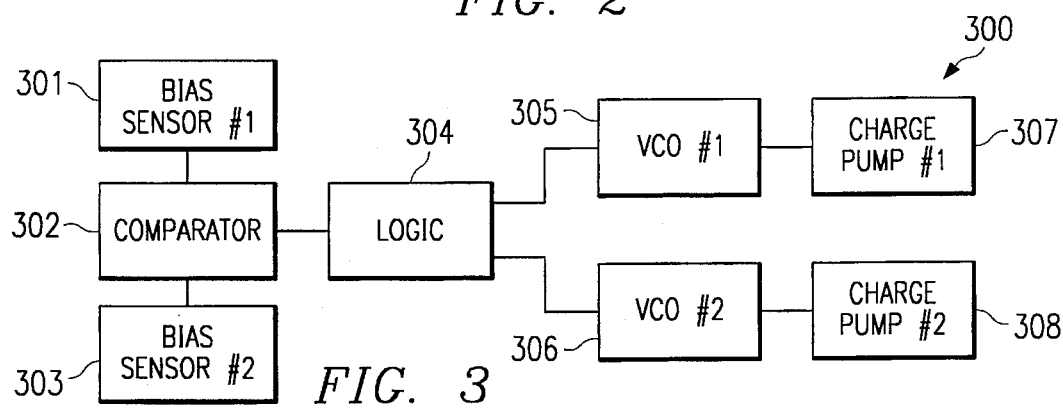
FIG. 3 is a functional block diagram of a second charge pumping system according to the principles of the present invention.

A second charge pump control system 300 embodying the principles of the present invention is depicted in FIG. 3. System 300 includes a plurality bias sensors 301 and 303, the voltage outputs of which are compared by comparator circuitry 302. The output of comparator circuitry is selectively passed to logic circuitry 304 which controls a plurality independent charge pumping circuits. A first charge pumping circuit includes voltage controlled oscillator 305 and a charge pump 307 and a second including voltage controlled oscillator 306 and charge pump 308.

In control system 300, oscillator 305 and charge pump 307 operate independently of oscillator 306 and charge pump 308. Bias sensors 301 and 303 preferably sense the substrate bias at spaced apart points on an associated substrate. Preferably, bias sensor 301 senses the bias voltage in a region of the substrate within the proximity of charge pump 307 and bias sensor 303 senses the bias voltage in a region of the substrate within the proximity of charge pump 307. The outputs of bias sensors 301 and 303 are compared by comparator circuitry 302 which generates in response a control signals representing to the voltage difference therebetween. These control signals may be digital or analog. In response, control logic 304 adjusts the output frequency of voltage controlled oscillators 305 and 306, and consequently the amount of electrons pumped into the regions of the substrate proximate charge pumps 307 and 308, to bring the substrate to an equipotential bias. For example, if the bias voltage in the area surrounding first bias sensor 301 decreases relative to that in the area surrounding second bias sensor 303, the frequency of first oscillator 305 would be increased to increase the number of electrons pumped into that area by first charge pump 307. It should be noted that charge pumps 307 and 308 and sensors 301 and 302 may be disposed in varying locations around substrate 400. The location of the charge pumps 307 and 308, and their spacing from sensors 301 and 302 will again depend on such factors as the location of the bond pads for interconnection to external devices and the resistance of substrate 200.

It should be recognized that control system 300 is only one possible embodiment of the of the present invention. In alternate embodiments, additional bias sensors may be provided to achieve improved sensing granularity across the substrate. Similarly, additional oscillator/charge pump circuits may be provided to improve the biasing granularity. In sum, multiple sensors and charge pumps according to the principles illustrated by the embodiment of FIG. 3 may be employed allow for more consistent biasing across a given substrate and/or the biasing of larger substrates. Among other things, and in alternate embodiments where three or more bias sensors are provided, comparator circuitry 302 will be required to perform multiple comparisons in order to obtain an bias voltage profile across the substrate. In this case, the control signals output from comparator 302 will vary in bit width (or in the number of signals or voltage level resolution if analog circuitry is used) accordingly to allow logic circuitry 304 to adjust the corresponding oscillators with sufficient resolution to achieve equipotential bias between substrate regions.

Figure 4:
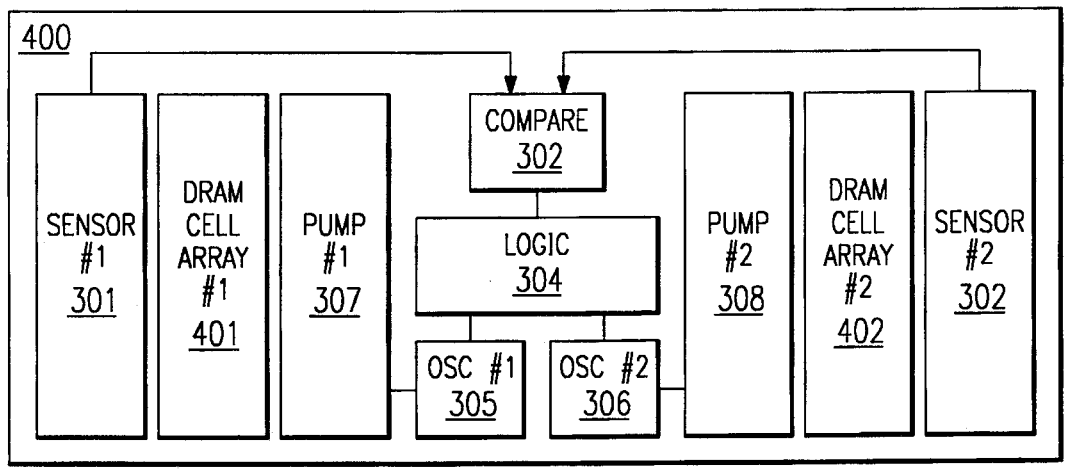
FIG. 4 is a plan view of an electronic circuit illustrating one application of the system of FIG. 3.

FIG. 4 depicts an exemplary application of control system 300. In this example, two DRAM cell arrays 401 and 402 have been fabricated on a single substrate 400. Sensor 301 has been disposed to sense the bias voltage at the outside periphery of DRAM cell array 401 while sensor 302 is disposed to sense the bias voltage at the outside periphery of DRAM cell array 302. First charge pump 307 controls the substrate bias in the region of cell array 401 while second charge pump 308 controls the substrate bias in the region of cell array 402. It should be noted that, as in the case of the application depicted in FIG. 2, the two memory array application of system 300 shown in FIG. 4 is exemplary and therefore that systems embodying the principles illustrated by system 300 may be employed in a number of applications where substrate biasing is required.

Although the present invention and its advantages have been described in detail, it should be understood that various changes, substitutions and alterations can be made herein without departing from the spirit and scope of the invention as defined by the appended claims.

What is claimed is:

1. Substrate bias control circuitry comprising:

a bias sensor for measuring a bias voltage of a substrate and generating a control signal in response;

a master oscillator for generating a first driving signal, a frequency of said first driving signal adjusted by said control signal;

a first charge pump for pumping electrons into said substrate in response to said first driving signal;

a slave oscillator for generating a second driving signal, a frequency of said second driving signal determined from said frequency of said first driving signal using a phased-locked loop; and a second charge pump for pumping electrons into said substrate in response to said second driving signal.

2. The substrate bias control circuitry of claim 1 and further comprising:

at least a second slave oscillator for generating a third driving signal, a frequency of said third driving signal determined from said frequency of said first driving signal using a phased-locked loop; and at least a third charge pump for pumping electrons into said substrate in response to said third driving signal.

3. The substrate bias control circuitry of claim 1 wherein said master oscillator comprises a voltage controlled oscillator.

4. The substrate bias control circuitry of claim 1 wherein said slave oscillator comprises a voltage controlled oscillator.

5. An electronic circuit comprising:

a substrate;

a bias sensor coupled to said substrate for measuring a substrate bias voltage;

a first oscillator for generating a first charge pump driving signal, a frequency of said first driving signal controlled by said bias sensor;

a first charge pump driven by said first driving signal for pumping electrons into said substrate;

a second oscillator for generating a second charge pump driving signal, said second charge pump driving signal phased-locked with said first driving signal; and a second charge pump driven by said second driving signal for pumping electrons into said substrate.

6. The electronic circuit of claim 5 wherein said charge pumps are fabricated in said substrate.

7. The electronic circuit of claim 5 wherein said master oscillator is fabricated in said substrate.

8. The electronic circuit of claim 5 wherein said slave oscillator is fabricated in said substrate.

9. The electronic circuit of claim 5 wherein said second drive signal is phased-locked with said first drive signal with a phased-locked loop.

10. The electronic circuit of claim 5 wherein dynamic random access memory cells are fabricated in said substrate.

11. Substrate bias voltage control circuitry comprising:

a first bias sensor for sensing the bias voltage of a first selected region of a substrate;

a second bias sensor for sensing the bias voltage of a second selected region of the substrate;

comparator circuitry for comparing an output of said first and second sensors and generating in response a control signal representing the difference therebetween;

first charge pumping circuitry including a first oscillator and a first charge pump coupled to said substrate;

second charge pumping circuitry including a second oscillator and a second charge pump coupled to said substrate; and control logic for adjusting the output frequencies of said first and second oscillators in response to said control signal to control said first and second charge pumps to achieve an equipotential bias across the substrate.

12. The circuitry of claim 11 wherein said first and second oscillators comprises voltage controlled oscillators each having an output frequency adjustable in response to a voltage received from said logic circuitry.

13. The circuitry of claim 11 and further comprising:

a least a third bias sensor for sensing the bias voltage of a third selected region of said substrate;

third charge pumping circuitry including a third oscillator and a third charge pump coupled to the substrate and responsive to the control logic; and wherein said comparator circuitry is further operable to compare an output of said third bias sensor with said outputs of said first and second bias sensors to generate control signals including said control signal, representing the differences therebetween and provided to said control logic.

14. The circuitry of claim 11 wherein said first charge pumping circuitry pumps electrons into said first region of said substrate.

15. The circuitry of claim 11 wherein said second charge pumping circuitry pumps electrons into said second region of said substrate.

16. The circuitry of claim 11 wherein said first charge pumping circuitry pumps electrons into said first region of said substrate and said second charge pumping circuitry pumps electrons into said second region of said substrate.

17. An electronic circuit comprising:

a substrate;

a plurality of sensors, each for sensing the bias voltage of a corresponding region of said substrate and outputting a proportionate sense signal, coupled to the substrate;

a plurality of charge pumping circuits for lowering the bias voltage of corresponding regions of said substrate, each said charge pumping circuit comprising an oscillator and a charge pump;

comparator circuitry for comparing said sense signals output from said sensors to generate control signals representing a profile of the bias voltage across said substrate; and control logic for adjusting the output frequencies of said oscillators in response to said control signals.

18. The circuit of claim 17 wherein said oscillators comprise voltage controlled oscillators, said logic presenting a voltage proportionate to an output frequency of a selected said oscillator to adjust said output frequency of said selected oscillator.

19. The circuit of claim 17 wherein said sensors output a voltage proportionate to said bias voltage of the corresponding said regions of said substrate.

20. The circuit of claim 17 wherein said sensors output a digital word representing said bias voltage of the corresponding said regions of said substrate.

21. The circuit of claim 17 wherein dynamic random access memory cells are fabricated in said substrate.

22. A method of controlling bias voltage across a substrate comprising the steps of:

measuring a bias voltage at a selected point on the substrate;

generating a first driving signal, a frequency of the first driving signal adjusted in response to the bias voltage measured at the selected point;

pumping electrons into the substrate in response to the first driving signal with a first charge pump;

generating a second driving signal, a frequency of the frequency of the second driving signal determined from the frequency of the first driving signal by a phased-locked loop; and pumping electrons into the substrate in response to the second driving signal with a second charge pump.

23. A method of controlling substrate bias comprising the steps of:

sensing the bias voltage of a plurality of regions of a substrate;

comparing the bias voltages sensed at each of the regions to establish a profile of the bias voltage across the substrate;

pumping electrons into the regions of the substrate to lower the bias voltage thereof with a corresponding plurality of charge pumping circuits; and adjusting the output voltage of the charge pumping circuits in response to the sensed profile of the bias voltage across the substrate.

* * * * *